March 17, 1970 C. J. MOLE 3,500,650

MULTISTAGE DIRECT TRANSFER THERMOELECTRIC APPARATUS

Filed May 13, 1968 2 Sheets-Sheet 1

WITNESSES:

Leon M. Garman

James F. Young

INVENTOR

Cecil J. Mole

BY Zigmund L. Dermer

ATTORNEY

March 17, 1970 C. J. MOLE 3,500,650

MULTISTAGE DIRECT TRANSFER THERMOELECTRIC APPARATUS

Filed May 13, 1968 2 Sheets-Sheet 2

United States Patent Office 3,500,650
Patented Mar. 17, 1970

3,500,650
MULTISTAGE DIRECT TRANSFER THERMOELECTRIC APPARATUS

Cecil J. Mole, Monroeville, Pa., assignor to Westinghouse Electric Corporation, Pittsburgh, Pa., a corporation of Pennsylvania Filed May 13, 1968, Ser. No. 728,472
Int. Cl. F25b *21/02*
U.S. Cl. 62—3 11 Claims

ABSTRACT OF THE DISCLOSURE

In a thermoelectric heat transfer system where the temperature difference between the hot and the cold sides is high, the efficiency of the system is improved by providing multistage devices in which a number of thermoelectric pellets are connected in series thermally and in parallel electrically. Thus, the temperature difference over any one pellet is reduced and heat is pumped by successive pellets. In a two-stage device, the applied current is divided into two smaller currents which drive the first and second stages. In the first stage, heat is pumped from the cold side members to interstage members. In the second stage, heat is pumped from the interstage members to the hot side members. This heat includes the heat pumped from the cold side, the energy required to pump the first stage, and the interstage member losses.

BACKGROUND OF THE INVENTION

This invention relates generally, to thermoelectric apparatus and, more particularly, to multistage direct transfer thermoelectric devices for creating temperature differences across the devices.

PRIOR ART

Single stage direct transfer thermoelectric devices are described in U.S. Patent No. 3,213,630, issued Oct. 26, 1965 to Cecil J. Mole and assigned to Westinghouse Electric Corporation. When utilized in a heat transfer system with high temperature gradients between the hot and the cold sides of the system, the efficiency of devices of the type disclosed in the aforesaid patent can be improved by providing multistage devices.

In U.S. Patent No. 3,359,139, issued Dec. 19, 1967 to N. E. Lindenblad and assigned to the United States of America, a thermoelectric device for generating electric current is formed of a thermally and electrically conductive metal heat sink within which three thermocouples are arranged to form a unitary structure with the heat sink. One thermocouple, to which heat is applied, is disposed centrally of the heat sink. A second thermocouple is located at the left of the first thermocouple and a third thermocouple is located at the right of the first thermocouple. The elements of the thermocouples are selected to operate at different temperature ranges and are connected by thermal and electrical conductors to permit heat to flow into the heat sink and electric current to be generated.

Accordingly, an object of this invention is to provide multistage thermoelectric heat transfer devices in which thermoelectric pellets of positive and negative types are connected in series thermally and in parallel electrically.

Another object of the invention is to so arrange first and second stage heat exchangers in a thermoelectric heat transfer system that fluid can be circulated through the exchangers to provide an efficient cooling system.

Other objects of the invention will be explained fully hereinafter or will be apparent to those skilled in the art.

SUMMARY OF THE INVENTION

In accordance with one embodiment of the invention, two-stage thermoelectric heat transfer apparatus includes heat exchangers, which may be of a fin or liquid conduit or other suitable type, arranged in pairs with the exchangers of each pair disposed on opposite sides of thermally and electrically conductive interstage members with P and N-type thermoelectric pellets or units so connected between the heat exchangers and the interstage members that the pellets are in series thermally and in parallel electrically. Applied current is divided into two smaller currents which drive the first and second stages. Heat is pumped from a fluid, gas or liquid, passing through the first stage heat exchangers into the interstage members and then from the interstage members into a fluid passing through the second stage heat exchangers. Thus heat is extracted from the fluid passing through the first stage exchangers to cool this fluid and the heat is rejected into the fluid passing through the second stage exchangers.

BRIEF DESCRIPTION OF THE DRAWINGS

For a better understanding of the nature and objects of the invention, reference may be had to the following detailed description, taken in conjunction with the accompanying drawings, in which.

DESCRIPTION OF THE PREFERRED EMBODIMENTS

Figures 1, 2, 3, 4:
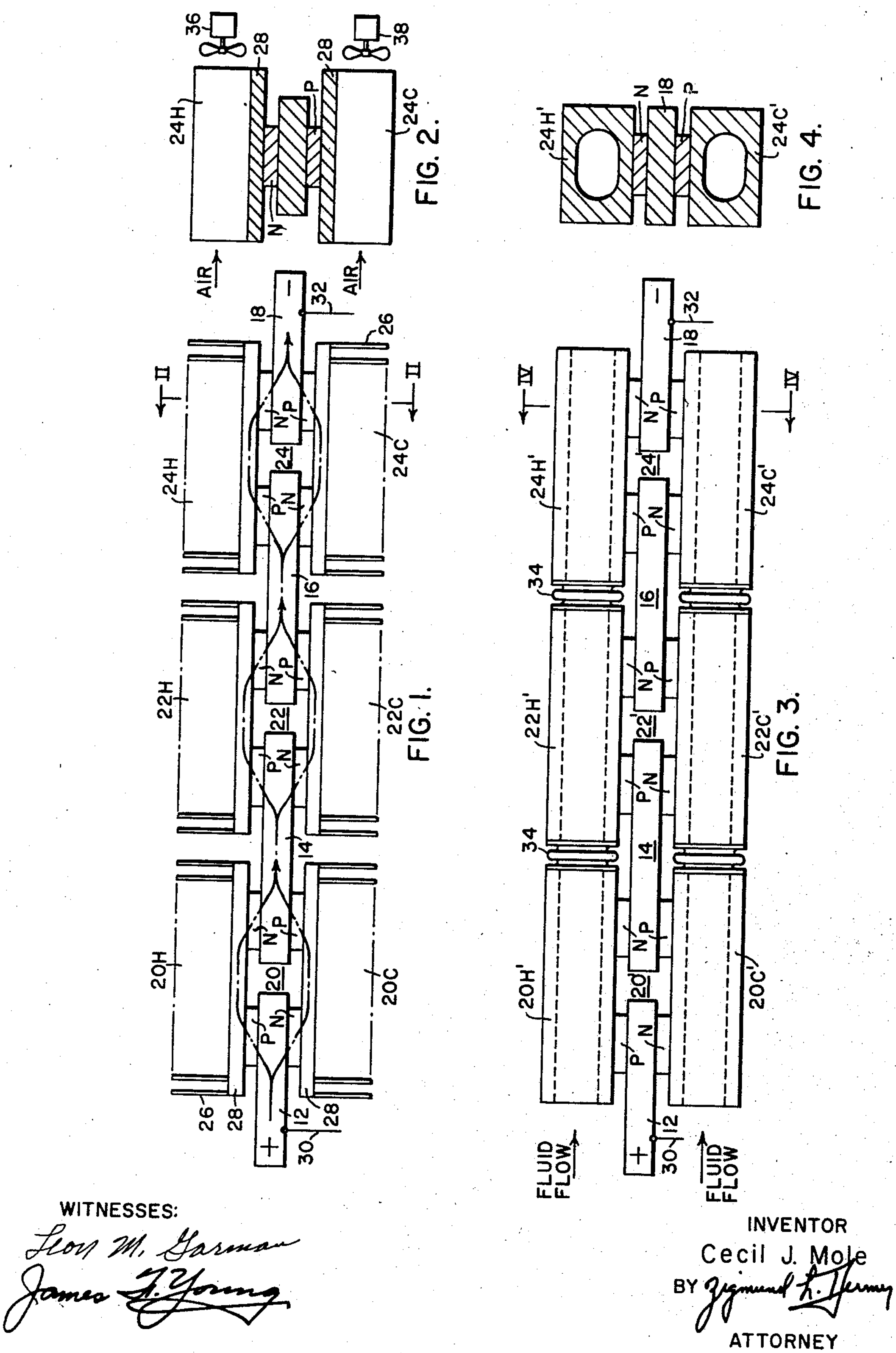
FIG. 1 is a diagrammatic view of an air-to-air version of two-stage thermoelectric heat transfer apparatus embodying principal features of the invention.
FIG. 2 is a sectional view taken along the line II—II in FIG. 1.
FIGS. 3 and 4 are views similar to FIGS. 1 and 2, respectively, of a water-to-water version of the heat transfer apparatus.

Referring to the drawings, particularly to FIGS. 1 and 2, the apparatus shown therein comprises a plurality of thermally and electrically conductive interstage members 12, 14, 16 and 18, a plurality of pairs of heat exchangers 20, 22 and 24, and P-type and N-type thermoelectric pellets or units designated by letters P and N. The exchangers of each pair are disposed on opposite sides of the interstage members. Thus, exchangers 20H, 22H and 24H, which are second stage members, are disposed on the hot side of the interstage members. Likewise, exchangers 20C, 22C and 24C, which are first stage members, are disposed on the cold side of the interstage members. The thermoelectric units are so connected between the heat exchangers and the interstage members that the units are in series thermally and in parallel electrically.

As shown in FIGS. 1 and 2, the heat exchangers are of a fin type suitable for circulating a gas, such as air through the exchangers. Each exchanger comprises a plurality of metal fins 26 secured to a metal base 28 as by brazing or welding. The exchangers are preferably composed of copper, or other metal, having good thermal and electrical conductivity. Likewise, the interstage members are composed of a metal having good thermal and electrical conductivity. The thermoelectric units are secured to the bases of the heat exchangers and to the interstage members by brazing or soldering. The thermoelectric units may be composed of any suitable thermoelectric material well known in the art. For example, the P-type units may be composed of antimony telluride and bismuth telluride. The N-type units may be composed of bismuth telluride and bismuth selenide.

As shown in FIG. 1, two pairs of thermoelectric units are provided for each pair of heat exchangers. The P and N units of one pair are connected by one interstage member and the N and P units of the other pair are connected by another interstage member. The polarities of the units are reversed. Thus, the P unit of one pair and the N unit of the other pair are connected to one heat exchanger and the N unit of the first pair and the P unit of the second pair are connected to the other heat exchanger of each pair of heat exchangers. The heat exchangers 20 and 22 are interconnected by the interstage member 14 which is connected between the N and P units of one pair of thermoelectric units for exchanger 20 and between the exchanger 22. Likewise, the heat exchangers 22 and P and N units of one pair of thermoelectric units for the 24 are interconnected by the interstage member 16. Electric power is supplied to the thermoelectric devices from a suitable direct current source (not shown) through a conductor 30 which is connected to the interstage member 12 and to the positive terminal of the source, and a conductor 32 which is connected to the interstage member 18 and to the negative terminal of the source. A fluid, such as air is circulated through the heat exchangers as shown by the arrows, by means of fans 36 and 38, or other suitable means.

When the conductors 30 and 32 are energized, the applied current is divided into two smaller currents which drive the first and second stages of the heat transfer apparatus. These currents may be equal or of different magnitudes. As shown by the solid lines and the arrows in FIG. 1, the first stage current passes from an N unit to a P unit along the base 28 of the heat exchanger 20C, resulting in a cold junction. It then passes from the P unit to another N unit along the interstage member 14, resulting in a hot junction, and then repeats the entire process successively. Heat is pumped from the air, or gas, passing through the fin assemblies of the cold side heat exchangers 20C, 22C and 24C into the interstage members 12, 14, 16 and 18. The second stage current passes from a P unit to an N unit along the base 28 of the heat exchanger 20H, resulting in a hot junction. It then passes from the N unit to another P unit along the interstage member 14, resulting in a cold junction, and repeats the entire process successively. Heat is pumped from the interstage members into the hot side fin assemblies of the heat exchangers. This heat includes the heat pumped from the air on the cold side, the energy required to pump the first stage, and the interstage member losses. The heat is rejected into the air being circulated through the hot side fin assemblies. Thus, heat is transferred from a fluid being circulated through the cold side heat exchangers to the fluid being circulated through the hot side heat exchangers. It will be understood that the system may be expanded to provide the desired cooling, or heating, effect.

The heat transfer system shown in FIGS. 1 and 2 is known as an air-to-air version. The system shown in FIGS. 3 and 4 is similar to the system shown in FIGS. 1 and 2 except that the heat exchangers on both sides of the interstage members are suitable for circulating a liquid, such as water, through the heat exchangers by means of pumps (not shown). Thus, this system is known as a water-to-water version.

The heat exchangers may comprise metal blocks having a circular passage therethrough as shown in FIGS. 3 and 4. They may be composed of a metal, such as copper, having good thermal and electrical conductivity. The exchangers also may be metal tubes having internal or external fins thereon, or other containers suitable for circulating a liquid therethrough. Adjacent blocks, or tubes, are interconnected by bellows 34 which may be composed of stainless steel or other suitable material. Due to the configuration of the bellows, they have a much higher electrical resistance than a pair of thermoelectric pellets. The current through the bellows is, therefore, limited to a small amount and has little effect on performance. Other known forms of flexible insulated joints may be utilized in place of the bellows.

When the conductors 30 and 32 are energized, the apparatus functions in the manner hereinbefore described to transfer heat from the liquid being circulated through the cold side exchangers 20C′, 22C′ and 24C′ into the interstage members 12, 14, 16 and 18 and then from the interstage members into the hot side exchangers 20H′, 22H′ and 24H′. The heat is rejected into the liquid being circulated through the hot side exchangers.

Figures 5, 6, 7, 8:
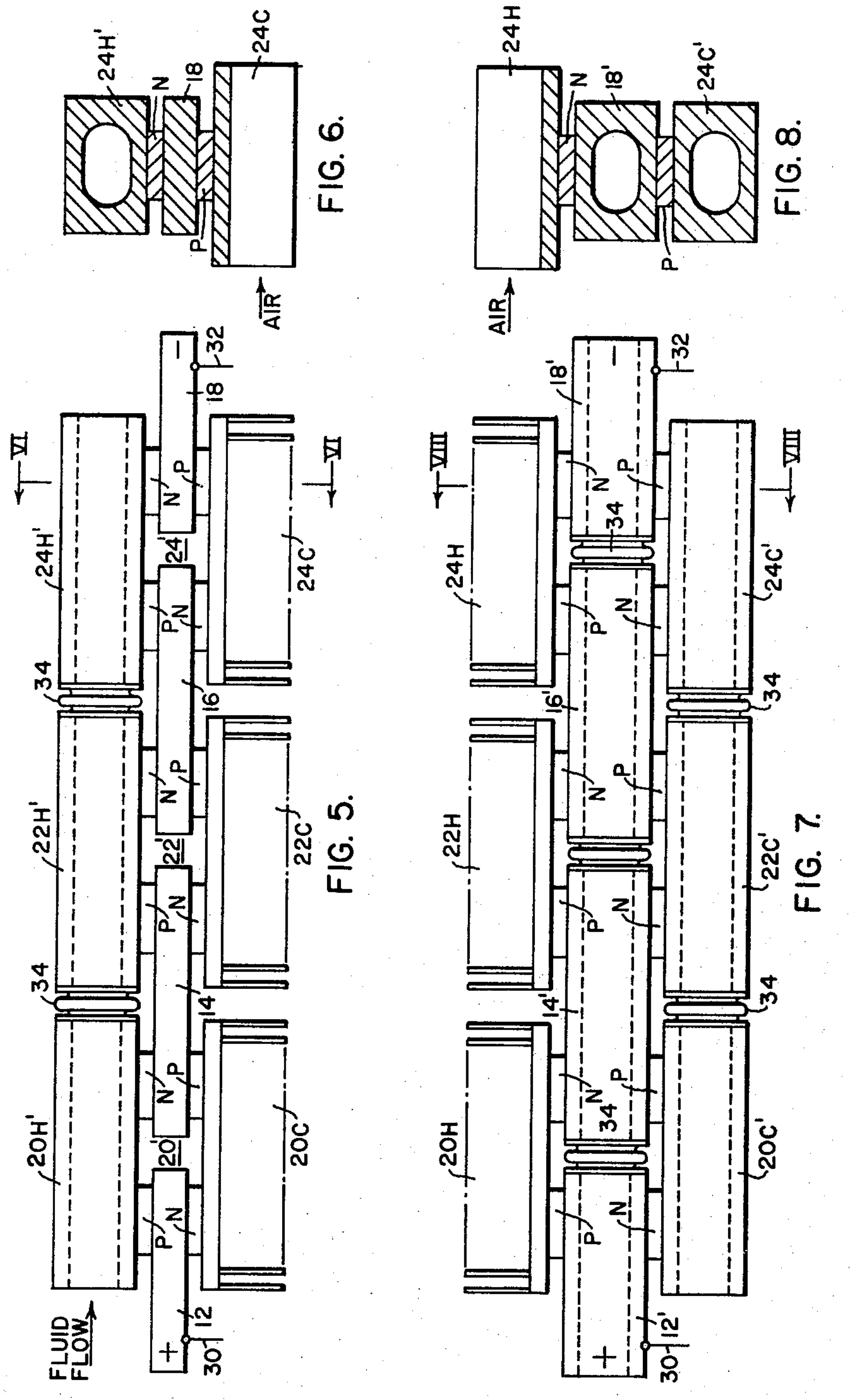
FIGS. 5 and 6, are views, similar to FIGS. 1 and 2, respectively, of an air-to-water version of the heat transfer apparatus.
FIGS. 7 and 8 are views, similar to FIGS. 1 and 2, respectively, of a water-to-water-to-air version of the heat transfer apparatus.

The system shown in FIGS. 5 and 6 is known as an air-to-water version. Thus, the heat exchangers 20*c*, 22C and 24C are of the fin type similar to those shown in FIGS. 1 and 2. The heat exchangers 20H′, 22H′, and 24H′ are of a type suitable for circulating a liquid therethrough and are similar to those shown in FIGS. 3 and 4. When the conductors 30 and 32 are energized the apparatus functions in the manner hereinbefore described to transfer heat from the air, or gas, being circulated through the cold side exchangers into the interstage members and then into the liquid being circulated through the hot side exchangers. It will be understood that the system can be reversed and utilized as a water-to-air version.

A further variation is illustrated in FIGS. 7 and 8 in which the interstage bar members are replaced with heat exchangers 12′, 14′, 16′, and 18′. Thus, another liquid or gas flow path is added. With this arrangement two liquids or gasses can be cooled at the same time with different temperature levels, flows and loads. When the conductors 30 and 32 are energized, the apparatus functions in the manner hereinbefore described to pump or transfer heat from the cold side heat exchangers 20C′, 22C′ and 24C′ into the interstage exchangers 12′, 14′, 16′ and 18′ and then into the hot side exchangers 20H, 22H and 24H. Thus, fluids being circulated through the cold side exchangers and through the intermediate or interstage exchangers are cooled to different temperature levels. It will be understood that the apparatus shown in FIGS. 7 and 8 may be arranged to provide various combinations or versions of heat transfer systems. Thus, by utilizing heat exchangers of different types air-air-air, water-water-water, air-air-water, water-water-air, water-air-air, water-air-water, air-water-air, different versions may be provided. Throughout the specification the term "fluid" includes liquid or gas, the term "liquid" includes water and the term "gas" includes air.

From the foregoing description, it is apparent that the invention provides for increasing the efficiency of a thermoelectric heat transfer system wherein the temperature difference between the hot and the cold sides of the system is relatively high. The efficiency of the system is improved by providing multistage devices in which thermoelectric pellets or units are connected in series thermally and in parallel electrically. Thus, the temperature difference over any one pellet is reduced and heat is pumped or transferred by successive pellets functioning in series. The apparatus is simple in construction and may be readily connected in a thermoelectric heat transfer system. The apparatus may be arranged to provide for cooling either a liquid or a gas or both.

Since numerous changes may be made in the above-described construction and different embodiments of the invention may be made without departing from the spirit and scope thereof, it is intended that all subject matter contained in the foregoing description or shown in the accompanying drawings shall be interpreted as illustrative and not in a limiting sense.

I claim:

1. In multistage thermoelectric heat transfer apparatus, in combination, a plurality of interstage members, each of said interstage members being unitary and formed substantially entirely from thermally and electrically conductive material, first and second stage heat exchangers arranged in pairs with the exchangers of each pair disposed on opposite sides of said members, P-type and N-type thermoelectric units connected between and secured directly to the heat exchangers and the interstage members in a manner such that the units are in series thermally and in parallel electrically, means for supplying electric current to the parallel connected thermoelectric units to transfer heat from the first stage heat exchangers into the interstage members and then from the interstage members into the second stage heat exchangers, and means for circulating a fluid through the heat exchangers.

2. The combination defined in claim 1, wherein each pair of heat exchangers includes a cold junction member and a hot junction member.

3. The combination defined in claim 2, wherein the current flows from N-type to P-type thermoelectric units which are connected by the cold junction members, and the current flows from P-type to N-type thermoelectric units which are connected by the hot junction members.

4. The combination defined in claim 2, wherein the cold junction members are on one side of the interstage members, and the hot junction members are on the opposite side of the interstage members.

5. The combination defined in claim 2, wherein adjacent pairs of heat exchangers are interconnected by interstage members which conduct electric current between the adjacent pairs of heat exchangers.

6. The combination defined in claim 2, wherein two pairs of P-type and N-type thermoelectric units are provided for each pair of heat exchangers, and the P and N units of one pair are connected by one interstage member, and the N and P units of the other pair are connected by another interstage member, and the polarities of the units are reversed.

7. The combination defined in claim 1, wherein the heat exchangers on both sides of the interstage members are of a fin type suitable for circulating a gas such as air through the exchanger.

8. The combination defined in claim 1, wherein the heat exchangers on both sides of the interstage members are of a type suitable for circulating a liquid through the exchangers.

9. The combination defined in claim 1, wherein the heat exchangers on one side of the interstage members are of a type suitable for circulating a liquid through the exchangers, and the heat exchangers on the other side of the interstage members are of a type suitable for circulating a gas through the exchangers.

10. The combination defined in claim 1, wherein the interstage members are heat exchangers of a type suitable for circulating a fluid through said exchangers.

11. In a thermoelectric assembly, at least two interstage members, each of said interstage members being unitary and formed substantially entirely from electrically and thermally conductive material, at least a pair of spaced electrically and thermally conductive heat exchange means, a body of P-type thermoelectric material extending between and secured to one of said interstage members and one of said heat exchange means, a body of N-type thermoelectric material extending between and secured to said one interstage member and the other of said heat exchange means, a body of N-type thermoelectric material extending between and secured to said one heat exchange means and the other of said interstage members, a body of P-type thermoelectric material extending between and secured to said other heat exchange member and said other interstage member, and means for passing electrical current from said one interstage member in parallel through said heat exchange means along a path through their respective thermoelectric bodies to said other interstage member, whereby one of the conditions of thermoelectric heating and cooling is imparted to said one heat exchange means and the other of the conditions of thermoelectric heating and cooling is imparted to said other heat exchange means.

References Cited

UNITED STATES PATENTS

| | | | |
|---|---|---|---|
| 2,978,875 | 4/1961 | Lackey | 62—3 |
| 3,019,609 | 2/1962 | Pietsch | 62—3 |
| 3,118,285 | 1/1964 | Malaker | 62—3 |
| 3,125,860 | 3/1964 | Reich | 62—3 |
| 3,137,142 | 6/1964 | Venema | 62—3 |
| 3,287,923 | 11/1966 | Elfving | 62—3 |

WILLIAM J. WYE, Primary Examiner